United States Patent
Lee

(10) Patent No.: US 9,602,272 B2
(45) Date of Patent: Mar. 21, 2017

(54) CLOCK AND DATA RECOVERY CIRCUIT AND SYSTEM USING THE SAME

(71) Applicant: SK hynix Inc., Icheon-si, Gyeonggi-do (KR)

(72) Inventor: Hyun Bae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/666,537

(22) Filed: Mar. 24, 2015

(65) Prior Publication Data

US 2016/0164667 A1 Jun. 9, 2016

(30) Foreign Application Priority Data

Dec. 5, 2014 (KR) .................. 10-2014-0174449

(51) Int. Cl.
| | |
|---|---|
| H04L 7/033 | (2006.01) |
| H03L 7/08 | (2006.01) |
| H04L 5/00 | (2006.01) |
| H03L 7/089 | (2006.01) |
| H03L 7/087 | (2006.01) |

(52) U.S. Cl.
CPC ............ H04L 7/033 (2013.01); H03L 7/0807 (2013.01); *H03L 7/087* (2013.01); *H03L 7/0891* (2013.01); *H03L 7/0896* (2013.01); *H04L 5/0053* (2013.01); *H04L 7/0337* (2013.01)

(58) Field of Classification Search
CPC ..... H04L 7/033; H04L 7/0337; H03L 7/0896; H03L 7/087; H03L 7/0891

USPC .................. 375/355, 359, 373–376
See application file for complete search history.

(56) References Cited

U.S. PATENT DOCUMENTS

| | | | |
|---|---|---|---|
| 7,003,066 B1 * | 2/2006 | Davies ................ | H03L 7/0814 375/374 |
| 8,537,955 B1 * | 9/2013 | Keane ................. | H03L 7/0807 327/156 |
| 2013/0259178 A1 | 10/2013 | Bae et al. | |
| 2014/0185633 A1 * | 7/2014 | Mills .................... | H04L 7/0337 370/517 |

\* cited by examiner

*Primary Examiner* — Janice Tieu
(74) *Attorney, Agent, or Firm* — William Park & Associates Ltd.

(57) ABSTRACT

A clock and data recovery circuit may include: a phase detection unit configured to generate an early phase detection signal and a late phase detection signal by comparing a clock signal and data; a filtering unit configured to generate an up signal and a down signal based on a number of generation times of the early phase detection signal and a number of generation times of the late phase detection signal; a phase information summing unit configured to receive an output of the filtering unit at each cycle of the clock signal, and generate first and second phase control signals by summing up numbers of the up signals and the down signals received from the filtering unit during a summing-up time; and a phase interpolator configured to adjust a phase of the clock signal according to the first and second phase control signals.

15 Claims, 5 Drawing Sheets

FIG.3A
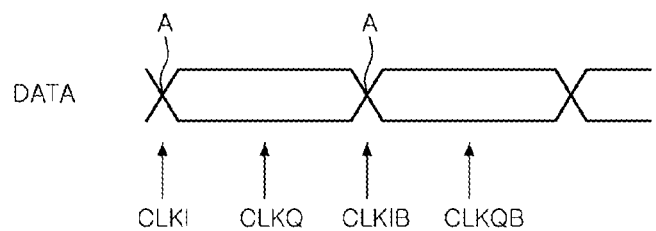
FIG.3B
| I ⊕ Q | Q ⊕ IB |       |
|-------|--------|-------|
| 0     | 1      | Late  |
| 1     | 0      | Early |
| 0     | 0      | X     |
| 1     | 1      | X     |
FIG.3C
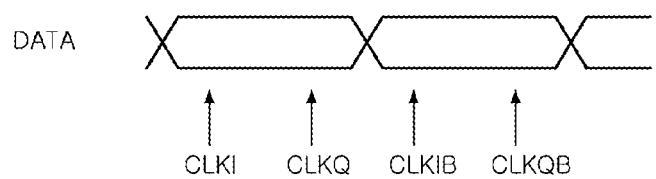
FIG.3D
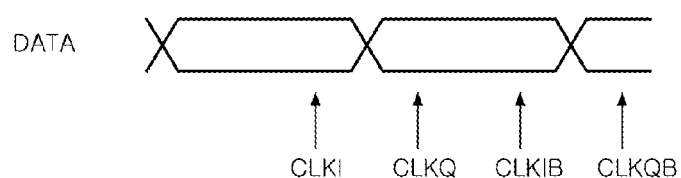

CLOCK AND DATA RECOVERY CIRCUIT AND SYSTEM USING THE SAME

CROSS-REFERENCES TO RELATED APPLICATION

The present application claims priority under 35 U.S.C. §119(a) to Korean application number 10-2014-0174449, filed on Dec. 5, 2014, in the Korean Intellectual Property Office, which is incorporated herein by reference in its entirety.

BACKGROUND

1. Technical Field

Various embodiments relate to a semiconductor device, and more particularly, to a clock and data recovery circuit and a system using the same.

2. Related Art

In general, a system which performs serial data communication through a small number of data buses uses a clock and data recovery method. The clock and data recovery method generates a reference clock signal from serial data, and uses the generated clock signal as a strobe signal for receiving data. Thus, a transmitter may transmit data having information related to the clock signal, and a receiver may generate a clock signal from the data and then receive the data from the transmitter in synchronization with the generated clock signal.

In order to minimize signal distortion caused by noise and jitter and to increase a data valid window, the receiver may compare the phase of the clock signal generated from the data to the transition point of the data, and adjust the phase of the clock signal.

SUMMARY

In an embodiment of the invention, a clock and data recovery circuit may include a phase detection unit configured to generate an early phase detection signal and a late phase detection signal by comparing a clock signal and data. The clock and data recovery circuit may also include a filtering unit configured to generate an up signal and a down signal based on a number of generation times of the early phase detection signal and a number of generation times of the late phase detection signal. The clock and data recovery circuit may also include a phase information summing unit configured to receive an output of the filtering unit at each cycle of the clock signal, and generate first and second phase control signals by summing up numbers of the up signals and the down signals received from the filtering unit during a summing-up time n times larger than the cycle of the clock signal where n is an integer equal to or more than two. The clock and data recovery circuit may also include a phase interpolator configured to adjust a phase of the clock signal according to the first and second phase control signals.

In an embodiment of the invention, a clock and data recovery circuit may include a phase detection unit configured to generate an early phase detection signal and a late phase detection signal by comparing a first clock signal and data. The clock and data recovery circuit may also include a filtering unit configured to generate an up signal and a down signal according to a number of generation times of the early phase detection signal and a number of generation times of the late phase detection signal. The clock and data recovery circuit may also include a phase information summing unit configured to sum up numbers of generation times of the up signal and the down signal in synchronization with the first clock signal, and output summing results as first and second phase control signals in synchronization to a second clock signal. The clock and data recovery circuit may also include a phase interpolator configured to adjust a phase of the first clock signal based on the first and second phase control signals, when being updated in synchronization with the second clock signal.

In an embodiment, a clock and data recovery circuit may include a phase detection unit configured to receive a clock signal and data and generate an early phase detection signal when an edge of the clock signal leads a transition point of the data and generate a late phase detection signal when the edge of the clock signal is behind the transition point of the data. The clock and data recovery circuit may also include a filtering unit configured to generate one of an up signal and a down signal when a difference between a number of generation times of the early phase detection signal and a number of generation times of the late phase detection signal reaches a predetermined value. The clock and data recovery circuit may also include a phase information summing unit configured to sum up numbers of the up signals and the down signals received during a summing-up time and generate a first and a second phase control signal. The clock and data recovery circuit may also include a phase interpolator configured to receive the first and second phase control signal and adjust a phase of the clock signal.

BRIEF DESCRIPTION OF THE DRAWINGS

FIGS. 3A to 3D are diagrams illustrating the operation of a phase detection unit of FIG. 2;

DETAILED DESCRIPTION

Hereinafter, a clock and data recovery circuit and a system using the same according to the invention will be described below with reference to the accompanying figures through various embodiments. Various embodiments are directed to a clock and data recovery circuit capable of acquiring phase information of a clock signal at a short cycle, and adjusting the phase of the clock signal at a longer cycle.

Figure 1:
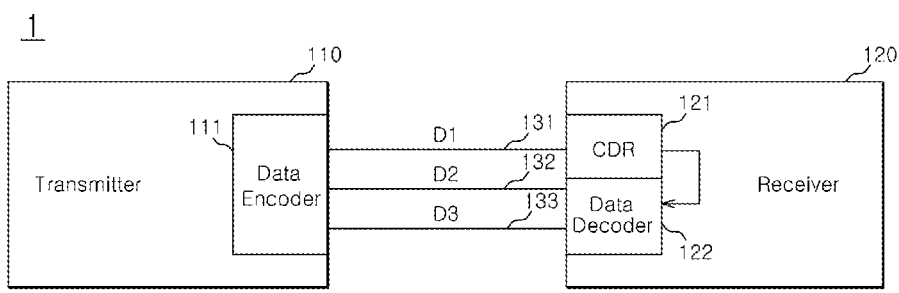
FIG. 1 is a diagram illustrating the configuration of a system according to an embodiment of the invention.

Referring to FIG. 1, a diagram illustrating the configuration of a system 1 according to an embodiment of the invention is shown. In FIG. 1, the system 1 may include a transmitter 110 and a receiver 120. The transmitter 110 may indicate a component representing a data transmission side which transmits data. In addition, the receiver 120 may indicate a component representing a data reception side which receives data from the transmitter 110. For example, the system 1 may include a master device and a slave device. When data is transmitted from the master device to the slave device, the master device may be set to the transmitter 110. Further, the slave device may be set to the receiver 120. On the other hand, when data is transmitted from the slave device to the master device, the master device may be set to the receiver 120. Further, the slave device may be set to the transmitter 110.

The transmitter 110 and the receiver 120 which form the system 1 may communicate with each other through a serial data transmission method using a small number of data buses. Referring to FIG. 1, the transmitter 110 may include a data encoder 111. The receiver 120 may include a clock and data recovery circuit (CDR) 121 and a data decoder 122. The transmitter 110 may be electrically coupled to the receiver 120 through a plurality of data buses 131, 132, and 133. FIG. 1 illustrates that three data buses 131, 132, and 133 are used. However, the invention is not limited. The transmitter 110 may generate data D1, D2, and D3 by encoding internal data through the data encoder 111. The data D1, D2, and D3 may be sequentially transmitted in series through the data buses 131, 132, and 133. The data D1, D2, and D3 may indicate data transmitted through the data buses 131, 132, and 133. In addition, the internal data may indicate data used in the transmitter 110 or the receiver 120.

The clock and data recovery circuit 121 of the receiver 120 may generate a clock signal CLK from the data transmitted through the data buses 131, 132, and 133. The clock signal CLK may be used as a strobe signal. Further, the receiver 120 may receive the data D1, D2, and D3 transmitted through the data buses 131, 132, and 133 in synchronization with the clock signal CLK. The data decoder 122 may convert the data D1, D2, and D3 transmitted through the data buses 131, 132, and 133 into internal data. The data encoder 111 and the data decoder 122 may include a conversion table for converting the internal data into the data D1, D2, and D3 or converting the data D1, D2, and D3 into the internal data.

The clock and data recovery circuit 121 may generate the clock signal from the data D1, D2, and D3, and adjust the phase of the clock signal CLK by comparing the clock signal CLK to the data D1, D2, and D3.

Figure 2:
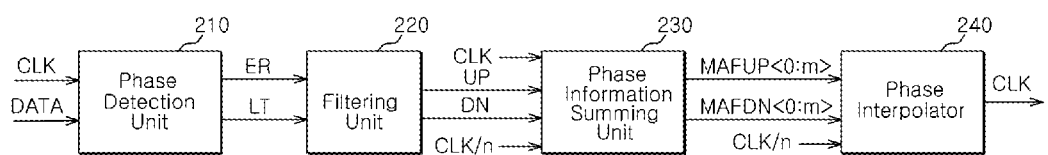
FIG. 2 is a diagram illustrating the configuration of a clock and data recovery circuit according an embodiment of the invention.

Referring to FIG. 2, a diagram illustrating the configuration of the clock and data recovery circuit 2 according an embodiment of the invention is shown. In FIG. 2, the clock and data recovery circuit 2 may include a phase detection unit 210, a filtering unit 220, a phase information summing unit 230, and a phase interpolator 240. The phase detection unit 210 may receive the clock signal CLK and data DATA. The phase detection unit 210 may also compare the clock signal CLK and the data DATA at each cycle of the clock signal CLK. For example, the phase detection unit 210 may detect whether an edge of the clock signal CLK leads or lags behinds a transition point of the data DATA. The phase detection unit 210 may compare the clock signal CLK and the data DATA. The phase detection unit 210 may also generate an early phase detection signal ER and a late phase detection signal LT. For example, the phase detection unit 210 may generate the early phase detection signal ER when the edge of the clock signal CLK leads the transition point of the data DATA. Further the phase detection unit 210 may generate the late phase detection signal LT when the edge of the clock signal CLK lags behind the transition point of the data DATA. The specific operation of the phase detection unit 210 will be described below.

The filtering unit 220 may receive the early phase detection signal ER and the late phase detection signal LT from the phase detection unit 210. The filtering unit 220 may also generate an up signal UP and a down signal DN. The filtering unit 220 may generate the up signal UP and the down signal DN based on how many times the early phase detection signal ER is generated (hereafter, referred to as the number of generation times of the early phase detection signal ER) and how many times the late phase detection signal LT is generated (hereafter, referred to as the number of generation times of the late phase detection signal LT). The filtering unit 220 may generate one of the up signal UP and the down signal DN, when a difference between the number of generation times of the early phase detection signal ER and the number of generation times of the late phase detection signal LT reaches a predetermined value. The predetermined value may correspond to the filter depth of the filtering unit 220. For example, when the filter depth is set to 3, the filtering unit 220 may generate the down signal DN where the number of generation times of the early phase detection signal ER is larger by three than the number of generation times of the late phase detection signal LT. Furthermore, the filtering unit 220 may generate the up signal UP where the number of generation times of the late phase detection signal LT is larger by three than the number of generation times of the early phase detection signal ER. In an embodiment, the filtering unit 220 may include a moving average filter.

The phase information summing unit 230 may receive an output signal of the filtering unit 220 at each cycle of the clock signal CLK. The phase information summing unit 230 may also sum up the numbers of the up signals UP and the down signals DN which are received from the filtering unit 220 during a time which is n times larger than the cycle of the clock signal CLK. At this time, n may indicate an integer equal to or more than 2. In an embodiment, n may correspond to the filter depth of the filtering unit 220, but is not limited thereto. The time which is n times larger than the cycle of the clock signal CLK may be set to a summing-up time. The phase information summing unit 230 may sum up the numbers of the up signals UP and the down signals DN which are received during the summing-up time. The phase information summing unit 230 also generate a first and second phase control signal MAFUP<0:m> and MAFDN<0:m>, respectively. For example, the phase information summing unit 230 may change the logical value of the first phase control signal MAFUP<0:m> according to the summed-up number of the up signals UP. Further, the phase information summing unit 230 may also change the logical value of the second phase control signal MAFDN<0:m> according to the summed-up number of the down signals DN. The first phase control signal MAFUP<0:m> may have information for delaying the phase of the clock signal CLK. In addition, the second phase control signal MAFDN<0:m> may have information for advancing the phase of the clock signal CLK.

The phase information summing unit 230 may receive the up signal UP or down signal DN outputted from the filtering unit 220 in synchronization with the clock signal CLK. The phase information summing unit 230 may also output the first and second phase control signals MAFUP<0:m> and MAFDN<0:m> in synchronization with a clock signal CLK/n having a cycle which is n times larger than the cycle of the clock signal CLK. Hereafter, the clock signal CLK will be referred to as a first clock signal. In addition, the clock signal CLK/n having a cycle which is n times larger than the cycle of the clock signal CLK will be referred to as a second clock signal. More specifically, the second clock signal CLK/n may have a frequency n times lower than the first clock signal CLK.

The phase interpolator 240 may receive the first and second phase control signal MAFUP<0:m> and MAFDN<0:m> from the phase information summing unit 230. The phase interpolator 240 may adjust the phase of the clock signal CLK based on the first and second phase control signal MAFUP<0:m> and MAFDN<0:m>. The phase interpolator 240 may receive the second clock signal CLK/n to synchronize the time points at which the first and second phase control signals MAFUP<0:m> and MAFDN<0:m> are received. As a result, the phase interpolator 240 may be updated in synchronization with the second clock signal CLK/n. The phase interpolator 240 may also adjust the phase of the clock signal CLK at each cycle of the second clock signal CLK/n based on the first and second phase control signals MAFUP<0:m> and MAFDN<0:m>.

Although not illustrated, the phase interpolator 240 may include a plurality of unit delay cells. The phase interpolator 240 may also adjust the phase of the clock signal CLK by controlling the number of unit delay cells which are turned on according to the first and second phase control signals MAFUP<0:m> and MAFDN<0:m>. The phase interpolator 240 may turn on or off one unit delay cell or turn on or off two or more unit delay cells at a time, according to the first and second phase control signals MAFUP<0:m> and MAFDN<0:m>. More specifically, the phase interpolator 240 may change the phase adjustment of the clock signal based on the first and second phase controls signal MAFUP<0:m> and MAFDN<0:m>.

The phase detection unit 210 may generate the early phase detection signal ER and the late phase detection signal LT at each cycle of the clock signal CLK. The filtering unit 220 may calculate the numbers of generation times of the early and late phase detection signals ER and LT generated at each cycle of the clock signal CLK. When the early and late phase detection signals ER and LT are alternately generated, it is impossible to specify the time at which the difference between the number of generation times of the early phase detection signal ER and the number of generation times of the late phase detection signal LT reaches the filter depth. Thus, the components electrically coupled after the filtering unit 220 needs to check whether the up signal UP or the down signal ND is generated from the filtering unit 220 at each cycle of the clock signal CLK. At this time, the phase information summing unit 230 may receive the up signal UP and the down signal DN generated from the filtering unit 220 in synchronization with the clock signal CLK. The phase information summing unit 230 may also sum up the numbers of the up signals UP and the down signals DN received during the time corresponding to the cycle of the second clock signal CLK/n. The phase information summing unit 230 may also provide the summing results as the first and second phase control signals MAFUP<0:m> and MAFDN<0:m> in synchronization with the second clock signal CLK/n. Accordingly, the phase interpolator 240 may be updated at each cycle of the second clock signal CLK/n, and the power consumption of the phase interpolator 240 may be reduced. When the phase information summing unit 230 does not exist, the phase interpolator 240 must receive the up signal UP and the down signal DN at each of the clock signal CLK. Then, as the update cycle becomes short, a large amount of power is inevitably consumed. Furthermore, the phase information summing unit 230 may enable the filtering unit to reliably function as a low pass filter, even though the filtering unit 220 is a moving average filter.

Referring to FIGS. 3A to 3D, diagrams illustrating the operation of the phase detection unit 210 of FIG. 2 are described. The phase detection unit 210 may compare the clock signal CLK and the data DATA, and generate the early phase detection signal ER and the late phase detection signal LT. The phase detection unit 210 may catch the levels of the data DATA at phases corresponding to 0, 90, 180, and 270 degrees of the clock signal CLK during one cycle of the clock signal CLK. For this operation, the phase detection unit 210 may use a divided clock signal obtained by dividing the clock signal CLK, and catch the level of the data DATA at a rising edge of the divided clock signal. The divided clock signal may be generated from the phase interpolator 240, and divided by the phase detection unit 210. In FIGS. 3A to 3C, a divided clock signal CLKI may have the same phase as the clock signal CLK. Further, a divided clock signal CLKQ may have a phase delayed by 90 degrees from the clock signal CLK. In addition, a divided clock signal CLKIB may have a phase delayed by 180 degrees from the clock signal CLK, and a divided clock signal CLKQB may have a phase delayed by 270 degrees from the clock signal CLK.

FIG. 3A illustrates a case in which the phase of the clock signal CLK does not need to be adjusted, that is, a locking state. In the locking state, rising edges of the divided clock signals CLKI and CLKIB may be positioned at transition points A of the data DATA, respectively. The rising edges of the divided clock signal CLKQ and CLKQB may be positioned at the centers of valid intervals of the data DATA, respectively. The phase detection unit 210 may perform an operation on the levels of the data DATA caught at the rising edges of the divided clock signals CLKI, CLKQ, CLKIB, and CLKQB. The phase detection unit 210 may also generate the early phase detection signal EQ and the late phase detection signal LT. The phase detection unit 210 may perform an XOR operation on the level of the data DATA, caught through the divided clock signal CLKI, and the level of the data DATA, caught through the divided clock signal CLKQ. Further, the phase detection unit 210 may also perform an XOR operation on the level of the data DATA, caught through the divided clock signal CLKQ, and the level of the data DATA, caught through the divided clock signal CLKIB. The phase detection unit 210 may generate the early phase detection signal ER and the late phase detection signal LT based on the XOR operation result. As illustrated in FIG. 3B, the phase detection unit 210 may determine that the phase of the edge of the clock signal CLK lags behind the transition point of the data DATA, when the XOR operation result is 0 because the levels I and Q of the data, caught through the divided clock signals CLKI and CLKQ, are equal to each other and the XOR operation is 1 because the levels Q and IB of the data, caught through the divided clock signals CLKQ and CLKIB, are different from each other. Then, the phase detection unit 210 may generate the late phase detection signal LT. On the other hand, the phase detection unit 210 may determine that the phase of the edge of the clock signal CLK leads the transition point of the data DATA, when the XOR operation result is 1 because the levels I and Q of the data, caught through the divided clock signals CLKI and CLKQ, are different from each other and the XOR operation result is 0 because the levels Q and IB of the data, caught through the divided clock signals CLKQ and CLKIB, are equal to each other. Then, the phase detection unit 210 may generate the early phase detection signal ER. In the other cases excluding the two above-described cases, the phase detection unit 210 may not generate both of the early phase detection signal ER and the late phase detection signal LT.

FIG. 3C illustrates a case in which the phase of an edge of the clock signal CLK lags behind a transition point of the data DATA. When the data DATA is toggled, the levels I and Q of the data, caught through the divided clock signals CLKI and CLKQ, may be equal to each other. Further, the levels Q and IB of the data, caught through the divided clock signals CLKQ and CLKIB, may be different from each other. Accordingly, in the case of FIG. 3C, the phase detection unit 210 may generate the late phase detection signal LT. Referring to FIG. 3D, a case in which the phase of an edge of the clock signal CLK leads a transition time of the data DATA is illustrated. The levels I and Q of the data, caught through the divided clock signals CLKI and CLKQ, may be different from each other. Further, the levels Q and IB of the data, caught through the divided clock signals CLKQ and CLKIB, may be equal to each other. Thus, in FIG. 3D, the phase detection unit 210 may generate the early phase detection signal ER.

Figure 4:
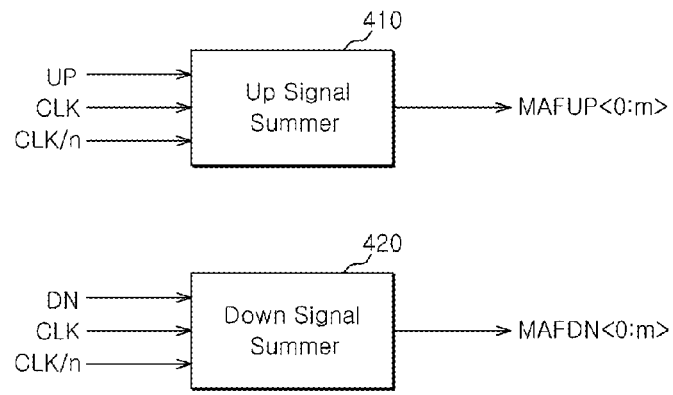
FIG. 4 is a block diagram schematically illustrating the configuration of a phase information summing unit of FIG. 2.

Referring to FIG. 4, a block diagram schematically illustrating the configuration of the phase information summing unit 230 of FIG. 2 is illustrated. In FIG. 4, the phase information summing unit 230 may include an up signal adder 410 and a down signal adder 420. The up signal adder 410 may receive the up signal UP outputted from the filtering unit 220, the clock signal CLK, and the second clock signal CLK/n. The up signal adder 410 may also generate the first phase control signal MAFUP<0:m>. The up signal adder 410 may sum up the number of up signals UP inputted during the summing-up time, and output the summing result. The up signal adder 410 may receive the up signal UP at each cycle of the clock signal CLK. The up signal adder 410 may also output information corresponding to the number of the up signals UP, summed up at each cycle of the second clock signal CLK/n, as the first phase control signal MAFUP<0:m>. The up signal adder 410 may output the number of the up signals UP, summed up during the summing-up time, as a plural-bit binary code.

The down signal adder 420 may receive the down signal DN outputted from the filtering unit 220, the clock signal CLK, and the second clock signal CLK/n. The down signal adder 420 may also generate the second phase control signal MAFDN<0:m>. The down signal adder 420 may sum up the number of the up signals UP inputted during the summing-up time, and output the summing result. The down signal adder 420 may receive the down signal DN at each cycle of the clock signal CLK, and output information corresponding to the number of the down signals DN, summed up at each cycle of the second clock signal CLK/n, as the second phase control signal MAFDN<0:m>. The down signal adder 420 may output the number of the down signals DN, summed up during the summing-up time, as a plural-bit binary code.

Figure 5:
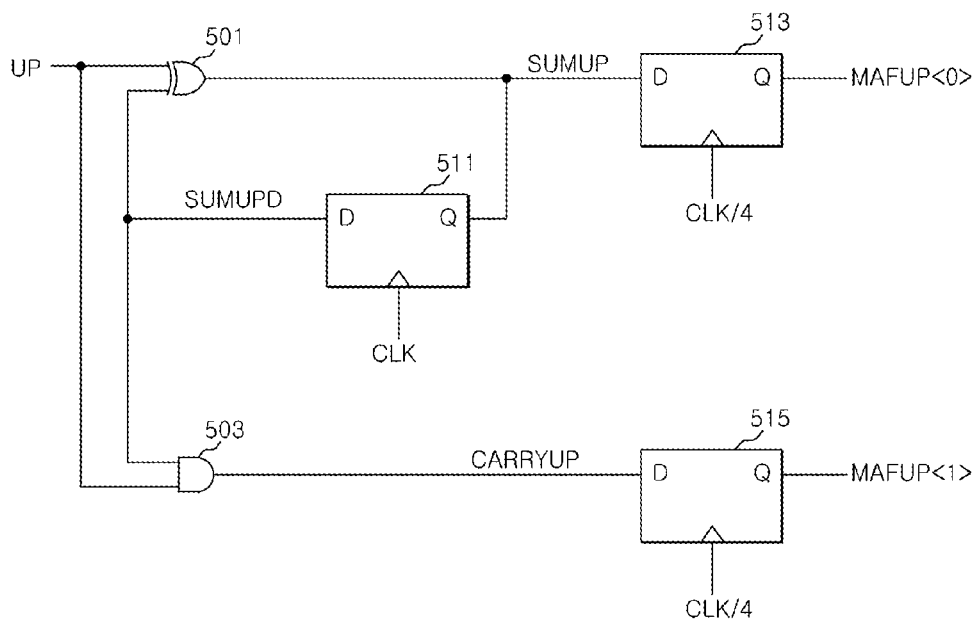
FIG. 5 is a diagram illustrating the configuration of an up signal adder of FIG. 4.

Referring to FIG. 5, a diagram illustrating the configuration of the up signal adder 410 of FIG. 4 is illustrated. In FIG. 5, the up signal adder 410 may include an XOR gate 510, an AND gate 503, and first to third flip-flops 511, 513, and 515. The XOR gate 501 may receive the up signal UP and an output of the first flip-flip 511 and generate a sum signal SUMUP. The AND gate 503 may receive the up signal UP and the output of the first flip-flip 511 and generate a carry signal CARRYUP. The first flip-flop 511 may receive the sum signal SUMUP and the clock signal CLK, and generate a delayed sum signal SUMUPD. The second flip-flop 513 may receive the sum signal SUMUP and the second clock signal CLK/4. The second flip-flop 513 may also generate the LSB MAFUP<0> of the first phase control signal. The third flip-flop 515 may receive the carry signal CARRYUP and the second clock signal CLK/4. The third flip-flop 515 may also generate the MSB MAFUP<1> of the first phase control signal. FIG. 5 illustrates a configuration in which n is set to 4 and the up signal adder 410 sums up two up signals UP during the summing-up time. However, the up signal adder 410 may be modified to sum up a larger number of up signals UP using the above-described method, or other components may be added to the up signal adder 410. The down signal adder 420 is different from the up signal adder 410 only in that the down signal adder 420 receives the down signal DN instead of the up signal UP. More specifically, the down signal adder 420 may have substantially the same configuration as the up signal adder 410.

Figure 6:
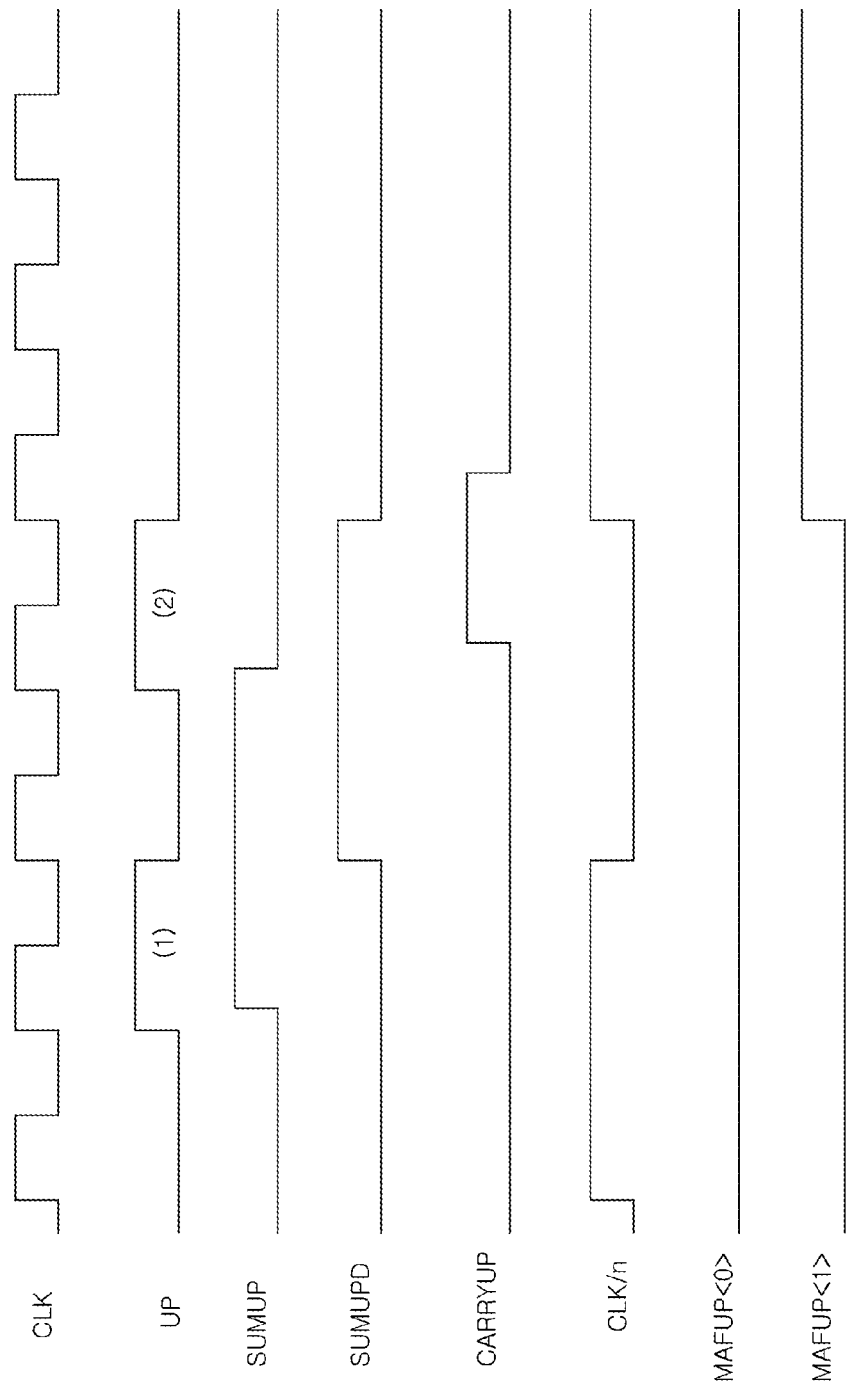
FIG. 6 is a timing diagram illustrating the operation of the up signal adder of FIG. 5.

Referring to FIG. 6, a timing diagram illustrating the operation of the up signal adder 410 of FIG. 5 is illustrated. In FIG. 6, suppose that two up signals UP are inputted during the summing-up time, that is, the cycle of the second clock signal CLK/n. When the first up signal UP1 is inputted, the XOR gate 501 may output a high-level sum signal SUMUP. Further, the AND gate 503 may output a low-level carry signal CARRYUP. The sum signal SUMUP may be delayed by the cycle of the clock signal CLK through the first flip-flop 511, and outputted as the delayed sum signal SUMUP. When the second up signal UP2 is inputted, the XOR gate 501 may output a low-level sum signal SUMUP. In addition, the AND gate 503 may output a high-level carry signal CARRYUP. The second flip-flop 513 may output the low-level sum signal SUMUP as the LSB MAFUP<0> of the first phase control signal in response to the second clock signal CLK/n. Further, the third flip-flop 515 may output the high-level carry signal CARRYUP as the MSB MAFUP<1> of the first phase control signal in response to the second clock signal CLK/n. Accordingly, the first phase control signal MAFUP<0:1> may have a logic value of 1 or 0, and have information indicating that the up signal UP was generated two times during the summing-up time.

Since the filtering unit 220 receives the early and late phase detection signals ER and LT outputted from the phase detection unit 210 at each cycle of the clock signal CLK and performs an operation on the received signals, the filtering unit 220 may acquire phase information at a relatively short cycle. The phase information summing unit 230 may sum up phase information acquired during a relatively long cycle, even though the phase detection unit 210 and the filtering unit 220 acquire phase information at a short cycle. The phase interpolator 240 may be updated based on the phase information summed up at each relatively long cycle. Thus, the power consumption of the clock and data recovery circuit 2 and the system 1 using the same can be efficiently reduced.

Figure 7:
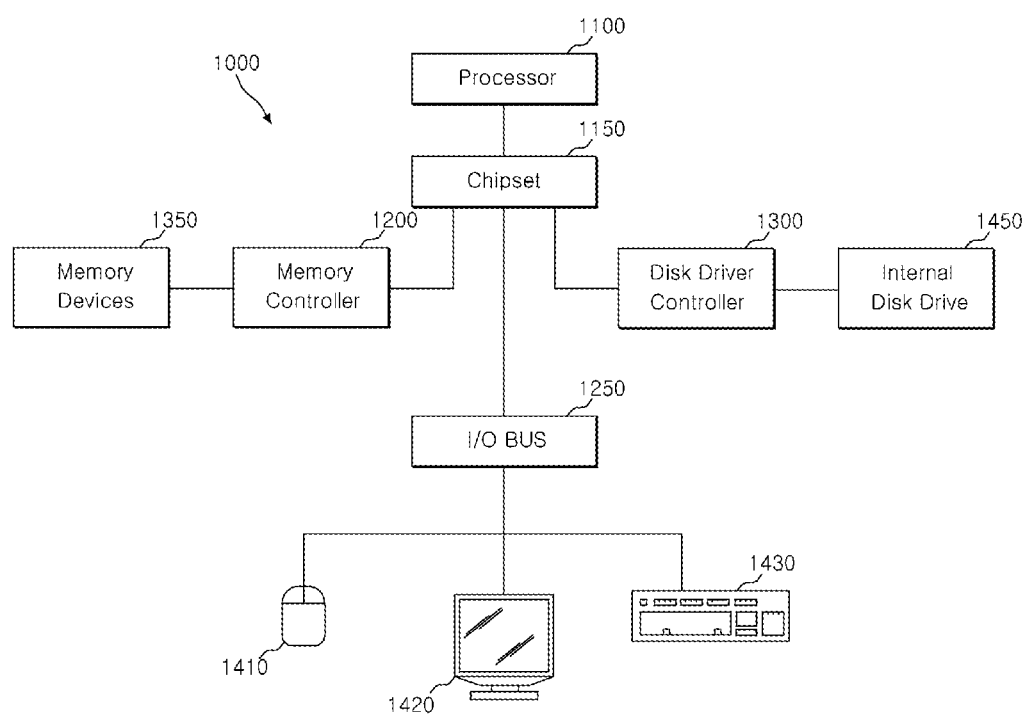
FIG. 7 illustrates a block diagram of a system employing a memory controller circuit in accordance with an embodiment of the invention.

Referring to FIG. 7 a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the clock and data recovery circuit mentioned above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

While certain embodiments have been described above, it will be understood to those skilled in the art that the embodiments described are by way of examples only. Accordingly, the clock and data recovery circuit described should not be limited based on the described embodiments. Rather, the clock and data recovery circuit described should only be limited in light of the claims that follow when taken in conjunction with the above description and accompanying figures.

What is claimed is:

1. A clock and data recovery circuit comprising:
    a phase detection circuit configured to generate an early phase detection signal and a late phase detection signal by comparing a clock signal and data;
    a filtering circuit configured to generate an up signal and a down signal based on a number of generation times of the early phase detection signal and a number of generation times of the late phase detection signal;
    a phase information summing circuit configured to receive an output of the filtering circuit at each cycle of the clock signal, and generate first and second phase control signals by summing up numbers of the up signals and the down signals received from the filtering circuit during a summing-up time n times larger than the cycle of the clock signal where n is an integer equal to or more than two; and
    a phase interpolator configured to adjust a phase of the clock signal according to the first and second phase control signals, when being updated at each cycle of the summing up time.

2. The clock and data recovery circuit of claim 1, wherein the phase detection circuit catches levels of the data at rising edges of a divided clock signal obtained by dividing the clock signal, and performs an operation on the caught levels to generate the early phase detection signal and the late phase detection signal.

3. The clock and data recovery circuit of claim 1, wherein the filtering circuit generates one of the up signal and the down signal, when a difference between the number of generation times of the early phase detection signal and the number of generation times of the late phase detection signal reaches a predetermined value.

4. The clock and data recovery circuit of claim 1, wherein the filtering circuit includes a moving average filter.

5. The clock and data recovery circuit of claim 1, wherein the phase information summing circuit comprises:
    an up signal adder configured to sum up the number of the up signals outputted from the filtering circuit during the summing-up time, and output the first phase control signal; and
    a down signal adder configured to sum up the number of the down signals outputted from the filtering circuit during the summing-up time, and output the second phase control signal.

6. The clock and data recovery circuit of claim 5, wherein the up signal adder receives the up signal at each cycle of the clock signal, and outputs the number of the up signals, summed up during the summing-up time, as a plural-bit binary code.

7. The clock and data recovery circuit of claim 5, wherein the down signal adder receives the down signal at each cycle of the clock signal, and outputs the number of the down signals, summed up during the summing-up time, as a plural-bit binary code.

8. A clock and data recovery circuit comprising:
    a phase detection circuit configured to generate an early phase detection signal and a late phase detection signal by comparing a first clock signal and data;
    a filtering circuit configured to generate an up signal and a down signal according to a number of generation times of the early phase detection signal and a number of generation times of the late phase detection signal;
    a phase information summing circuit configured to sum up numbers of generation times of the up signal and the down signal in synchronization with the first clock signal, and output summing results as first and second phase control signals in synchronization to a second clock signal; and
    a phase interpolator configured to adjust a phase of the first clock signal according to the first and second phase control signals, when being updated in synchronization with the second clock signal.

9. The clock and data recovery circuit of claim 8, wherein a cycle of the second clock signal is n times larger than a cycle of the first clock signal where n is an integer equal to or more than two.

10. The clock and data recovery circuit of claim 8, wherein the phase detection circuit catches levels of the data at rising edges of a divided clock signal obtained by dividing the first clock signal, and performs an operation on the caught levels to generate the early phase detection signal and the late phase detection signal.

11. The clock and data recovery circuit of claim 8, wherein the filtering circuit generates one of the up signal and the down signal, when a difference between the number of generation times of the early phase detection signal and the number of generation times of the late phase detection signal reaches a predetermined value.

12. The clock and data recovery circuit of claim 8, wherein the filtering circuit includes a moving average filter.

13. The clock and data recovery circuit of claim 8, wherein the phase information summing circuit comprises:
    an up signal adder configured to sum up a number of the up signals outputted from the filtering circuit during a time corresponding to a cycle of the second clock signal, and output the summing result; and
    a down signal adder configured to sum up a number of the down signals outputted from the filtering circuit during the time corresponding to the cycle of the second clock signal, and output the summing result.

14. The clock and data recovery circuit of claim 13, wherein the up signal adder receives the up signal at each cycle of the first clock signal, and outputs the number of the up signals, summed up during a time corresponding to the cycle of the second clock signal, as a plural-bit binary code.

15. The clock and data recovery circuit of claim 13, wherein the down signal adder receives the down signal at each cycle of the first clock signal, and outputs the number of the down signals, summed up during the time corresponding to the cycle of the second clock signal, as a plural-bit binary code.

* * * * *